United States Patent
Bhavaraju et al.

(10) Patent No.: US 11,749,997 B2
(45) Date of Patent: Sep. 5, 2023

(54) SYNCHRONIZATION OF ELECTRICAL POWER GRIDS

(71) Applicant: Eaton Intelligent Power Limited, Dublin (IE)

(72) Inventors: Vijay Bhavaraju, Arvada, CO (US); Souvik Chandra, Lakewood, CO (US); Abrez Mondal, Lakewood, CO (US); Yi Yang, Arvada, CO (US)

(73) Assignee: Eaton Intelligent Power Limited, Dublin (IE)

( * ) Notice: Subject to any disclaimer, the term of this patent is extended or adjusted under 35 U.S.C. 154(b) by 19 days.

(21) Appl. No.: 17/320,841

(22) Filed: May 14, 2021

(65) Prior Publication Data
US 2021/0384736 A1 Dec. 9, 2021

Related U.S. Application Data

(60) Provisional application No. 63/035,061, filed on Jun. 5, 2020.

(51) Int. Cl.
*H02J 3/42* (2006.01)
*G01R 19/25* (2006.01)
*H02J 3/44* (2006.01)

(52) U.S. Cl.
CPC ............ *H02J 3/42* (2013.01); *G01R 19/2513* (2013.01); *H02J 3/44* (2013.01)

(58) Field of Classification Search
CPC ............ H02J 3/42; H02J 3/44; G01R 19/2513
USPC ......................................................... 307/18
See application file for complete search history.

(56) References Cited

U.S. PATENT DOCUMENTS

| 9,128,130 B2 | 9/2015 | Seeley |
| 9,720,395 B2 | 8/2017 | Shi et al. |
| 9,800,055 B2 | 10/2017 | Seeley |
| 10,156,225 B2 | 12/2018 | Huang et al. |
| 2003/0222507 A1* | 12/2003 | Deng .................. H02J 3/40 307/87 |

(Continued)

FOREIGN PATENT DOCUMENTS

CN 103560535 A 2/2014

OTHER PUBLICATIONS

Christian Bergler, European International Searching Authority, International Search Report and Written Opinion, counterpart PCT Application No. PCT/EP2021/025197, dated Aug. 23, 2021, 15 pages total.

*Primary Examiner* — Hal Kaplan
(74) *Attorney, Agent, or Firm* — DiBerardino McGovern IP Group LLC

(57) ABSTRACT

Electrically connecting a first node of a first power grid to a second node of a second power grid includes: determining a phase angle of at least one phase of an AC voltage at the first node in the first power grid; determining a phase angle of at least one phase of an AC voltage at the second node in the second power grid; determining a phase angle metric based on comparing the phase angle of the AC voltage in the first power grid to the phase angle of the AC voltage in the second power grid; comparing the phase angle metric to a phase angle threshold; and if the phase angle metric is equal to or exceeds the phase angle threshold, controlling a dispatchable energy source in the first power grid in a P-Q control mode to adjust the phase angle of at least one phase of the AC voltage at the first node.

38 Claims, 6 Drawing Sheets

(56) References Cited

U.S. PATENT DOCUMENTS

| | | |
|---|---|---|
| 2011/0248569 A1 | 10/2011 | Son et al. |
| 2017/0187188 A1 | 6/2017 | Aubert Guyon et al. |
| 2018/0219380 A1 | 8/2018 | Dong et al. |
| 2019/0103743 A1 | 4/2019 | Sun et al. |

* cited by examiner

SYNCHRONIZATION OF ELECTRICAL POWER GRIDS

CROSS-REFERENCE TO RELATED APPLICATION

This application claims the benefit of U.S. Provisional Application No. 63/035,061, filed on Jun. 5, 2020 and titled SYNCHRONIZATION OF ELECTRICAL POWER GRIDS, which is incorporated herein by reference in its entirety.

TECHNICAL FIELD

This disclosure relates to electrical power grid synchronization, for example, synchronization of the alternating-current (AC) voltage in two independent power grids prior to electrically connecting the power grids to each other.

BACKGROUND

An electrical power grid includes one or more sources of electricity, one or more loads, and mechanisms for distributing electrical power from the sources to the loads. Some electrical power grids are capable of operating either in an islanded state in which the power grid operates independently or in a grid-tied state in which the power grid is electrically connected to another independent electrical power grid and operates in parallel with it.

SUMMARY

In one aspect, a system includes: an interface configured to receive electrical data, the electrical data including: an amplitude, frequency, and phase angle of at least one phase of an alternating current (AC) voltage at a first node in a first power grid, and an amplitude, frequency, and phase angle of at least one phase of an AC voltage at a second node in a second power grid. The first power grid and the second power grid are configured to be operated independently of each other with the first node disconnected from the second node, or to be electrically connected to each other by electrically connecting the first node and the second node at a point of interconnection. The system also includes a controller configured to: access the electrical data; determine an amplitude metric based on the amplitude of the AC voltage at the first node and the amplitude of the AC voltage at the second node; determine a frequency metric based on the frequency of the AC voltage at the first node and the frequency of the AC voltage at the second node; determine a phase angle metric by based on the phase angle of the AC voltage at the first node and the phase angle of the AC voltage at the second node; compare the amplitude metric, frequency metric, and phase angle metric to respective amplitude, frequency, and phase angle thresholds; and determine, based on the comparison, whether to control a first dispatchable energy source to adjust the amplitude and frequency of at least one phase of the AC voltage at the first node and whether to control a second dispatchable energy source to adjust the phase angle of at least one phase of the AC voltage at the first node.

Implementations may include one or more of the following features. The amplitude metric may include an absolute value of a difference between the amplitude of the AC voltage at the first node and the amplitude of the AC voltage at the second node; the frequency metric may include an absolute value of a difference between the frequency of the AC voltage at the first node and the frequency of the AC voltage at the second node; and the phase angle metric may include an absolute value of a difference between the phase angle of the AC voltage at the first node and the phase angle of the AC voltage at the second node. To determine whether to control the second dispatchable energy source, the controller may be configured to determine whether the phase angle metric is equal to or greater than the phase angle threshold, and, if the phase angle metric is equal to or greater than the phase angle threshold, the controller may apply a second command signal to the second dispatchable energy source, where the second command signal includes a P component and a Q component; the P component is a real power command, and the Q component is a reactive power command; and applying the second control signal to the second dispatchable energy source adjusts the phase angle of at least one phase of the AC voltage at the first node. The real power command may include a real power value, the reactive power command may include a reactive power value, and the controller may be further configured to determine if the real power value is within a first pre-defined range of values, and to determine if the reactive power value is within a second pre-defined range of values. In some implementaitons, the controller sets the real power value to a maximum or minimum value of the first pre-determined range of values and sets the reactive power value to a maximum or minimum value of the second pre-determined range of values if the real power value is not within the first pre-defined range of values and the reactive power value is not within the second pre-defined range of values. The interface also may be configured to receive input other than the electrical data, and the controller may determine the second command signal based on the electrical data and the input other than the electrical data. The input other than the electrical data may include one or more control parameters provided by an operator or a remote device through the interface.

In some implementations, to determine whether to control the first dispatchable energy source, the controller is configured to: determine whether the frequency metric is equal to or greater than the frequency threshold, and determine whether the amplitude metric is equal to or greater than the amplitude threshold; and if the frequency metric is equal to or greater than the frequency threshold and the amplitude metric is equal to or greater than the amplitude threshold, the controller applies a first command signal to the first dispatchable energy source. In these implementations, the first command signal is configured to control the first dispatchable energy source in a V-f control mode to control the amplitude and frequency of at least one phase of the AC voltage at the first node, and the first command signal includes V component and an f component, the V component being a voltage amplitude command, and the f component being a frequency command. The controller may be configured to compare the amplitude metric to the amplitude threshold and to compare the frequency metric to the frequency threshold before comparing the phase angle metric to the phase angle threshold.

The system also may include a switching apparatus that has a first state and a second state, where the switching apparatus electrically connects the first node of the first power grid to the second node of the second power grid at a point of interconnection when in the second state, and if the phase angle metric does not exceed the phase angle threshold, the amplitude metric does not exceed the amplitude threshold, and the frequency metric does not exceed the frequency threshold, the controller provides a switching apparatus command to the switching apparatus to cause the switching apparatus to transition from the second state to the first state to electrically connect the second power grid and the first power grid. The switching apparatus may be a recloser, the first state may be a closed state, and the second state may be an opened state.

The AC voltage at the first node may have N phases; the AC voltage at the second node may have N phases, where N is an integer value that is greater than or equal to one; and the amplitude metric, the frequency metric, and the phase angle metric are determined for each of the N phases.

The first power grid may be a microgrid, and the second power grid may be a microgrid or a utility grid. In some implementations, the amplitude, frequency, and phase of the second power grid are not adjustable.

The first dispatchable energy source includes a first distributed energy resource (DER), and the second dispatchable energy source includes a second distributed energy resource (DER). The first dispatchable energy source and the second dispatchable energy source may be associated with the first power grid; and the amplitude, frequency, and phase of the second power grid may be fixed or not adjustable.

The second grid may include a third dispatchable energy source and a fourth dispatchable energy source; and the controller may be further configured to determine whether to control the third dispatchable energy source to adjust the amplitude and frequency of at least one phase of the AC voltage at the second node and whether to control the fourth dispatchable energy source to adjust the phase angle of at least one phase of the AC voltage at the second node.

The first dispatchable energy source and the second dispatchable energy source may be associated with the first power grid. The controller may be associated with the second power grid and configured to communicate with the first dispatchable energy source and the second dispatchable energy source.

In another aspect, a method of electrically connecting a first node of a first power grid to a second node of a second power grid includes: determining a phase angle of at least one phase of an AC voltage at the first node in the first power grid; determining a phase angle of at least one phase of an AC voltage at the second node in the second power grid; determining a phase angle metric based on comparing the phase angle of the AC voltage in the first power grid to the phase angle of the AC voltage in the second power grid; comparing the phase angle metric to a phase angle threshold; and if the phase angle metric is equal to or exceeds the phase angle threshold, controlling a dispatchable energy source in the first power grid in a P-Q control mode to adjust the phase angle of at least one phase of the AC voltage at the first node.

Implementations may include one or more of the following features. The method also may include: determining an amplitude metric by comparing an amplitude of at least one phase of the AC voltage at the first node and an amplitude of at least one phase of AC voltage at the second node; determining a frequency metric by comparing a frequency of at least one phase of AC voltage in the second power grid and a frequency of at least one phase of AC voltage in the first power grid; comparing the amplitude metric to an amplitude threshold; comparing the frequency metric to a frequency threshold; and if the amplitude metric exceeds the amplitude threshold and the frequency metric exceeds the frequency threshold, controlling the voltages and frequencies of electrical voltage produced by another dispatchable energy source in the first power grid to adjust the voltage and frequency of at least one phase of the AC voltage at the first node. In some implementations, if the phase angle metric does not exceed the phase angle threshold, the amplitude metric does not exceed the amplitude metric, and the frequency metric does not exceed the frequency metric, a switching apparatus is controlled to electrically connect the first node and the second node to thereby electrically connect the first power grid and the second power grid at a point of interconnection.

The dispatchable energy source controlled in the P-Q mode may be a second dispatchable energy source in the first power grid, and the method also may include controlling a first dispatchable energy source in the first power grid in a V-f mode to thereby control a frequency difference between the AC voltage at the first node and the AC voltage at the second node, where controlling the second dispatchable energy source in the first power grid in the P-Q mode may include controlling the second dispatchable energy source in the first power grid in the P-Q mode to thereby inject power into or remove power from the first power grid to adjust the phase angle of at least one phase of the AC voltage at the first node. The method also may include measuring a power output of the first dispatchable energy source, which is in the V-f mode; and adjusting the power output of the second dispatchable energy source, which is in the P-Q mode, such that the power output of the first dispatchable energy source which is in the V-f mode, is not effected by controlling the second dispatchable energy source in the P-Q mode.

In some implementations, if the phase angle metric is equal to or exceeds the phase angle threshold, a dispatchable energy source in the second power grid is controlled in a P-Q control mode to adjust the phase angle of at least one phase of the AC voltage at the second node.

In another aspect, a controller for electrically connecting a second power grid to a first power grid includes: an electronic processing module; and an electronic storage coupled to the electronic processing module, the electronic storage including instructions that, when executed by the electronic processing module, cause the electronic processing module to: access electrical data from the first power grid and from the second power grid to determine one or more synchronization metrics; analyze the one or more synchronization metrics; determine whether or not to electrically connect the second power grid to the first power grid based on the analysis; if it is determined to electrically connect the second power grid to the first power grid, control a switching apparatus to electrically connect the second power grid to the first power grid; and if it is determined to not electrically connect the second power grid to the first power grid: control a first dispatchable energy source in a V-F control mode to control a difference between the amplitude and frequency of the AC voltage in the first power grid and the amplitude and frequency of the AC voltage in the second power grid; and control a second dispatchable energy source in a P-Q control mode to reduce a difference between a phase angle of the AC voltage in the first power grid and a phase angle of the AC voltage in the second power grid.

Implementations may include one or more of the following features. Controlling the first dispatchable energy source in V-F control may adjust an amplitude and frequency of the AC voltage in the first power grid to control the difference between the amplitude and frequency of the AC voltage in the first power grid and the amplitude of the AC voltage in the second power grid.

The synchronization metrics may include: an amplitude metric, a frequency metric, and a phase angle metric. The amplitude metric may include a difference between an amplitude of an AC voltage at a first node in the first power grid and an amplitude of an AC voltage at a second node in the second power grid; the frequency metric may include a difference between a frequency of an AC voltage at the first node in the first power grid and a frequency of an AC voltage at the second node in the second power grid; and the phase angle metric may include a difference between a phase angle of an AC voltage at the first node in the first power grid and a phase angle of an AC voltage at the second node in the second power grid.

The first dispatchable energy source and the second dispatchable energy source may be in the first power grid; and the controller may be remote from the first power grid.

In some implementations, the electronic storage further includes instructions that, when executed, cause the electronic processor to, if it is determined to not electrically connect the second power grid to the first power grid: control a third dispatchable energy source in a V-F control mode to control the difference between the amplitude and frequency of the AC voltage in the first power grid and the amplitude and frequency of the AC voltage in the second power grid; and control a fourth dispatchable energy source in a P-Q control mode to reduce the difference between a phase angle of the AC voltage in the first power grid and a phase angle of the AC voltage in the second power grid, where the first and second dispatchable energy sources are in the first power grid, and the third and fourth dispatchable energy sources are in the second power grid.

Implementations of any of the techniques described herein may include a system, a controller, a control system, a method, a system that includes a control system and a switching apparatus, and/or a kit for retrofitting an existing control system. The details of one or more implementations are set forth in the accompanying drawings and the description below. Other features will be apparent from the description and drawings, and from the claims.

DRAWING DESCRIPTION

DETAILED DESCRIPTION

Figure 1A:
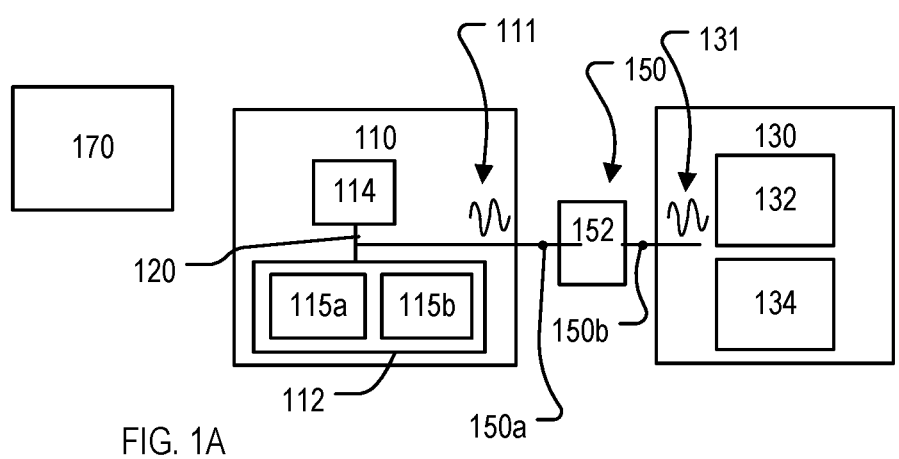
FIG. 1A is a block diagram of an example of an alternating-current (AC) electrical power distribution system.
Figure 1B:
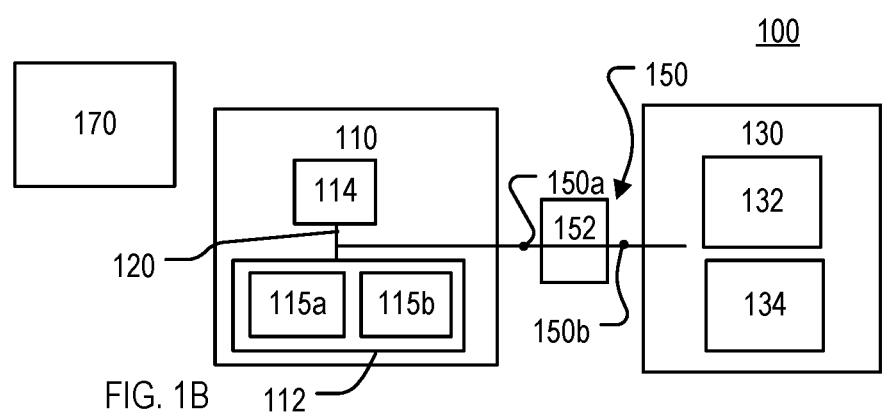
FIG. 1B is another block diagram of the alternating-current (AC) electrical power distribution system of FIG. 1A.

FIGS. 1A and 1B are block diagrams of an example of an alternating-current (AC) electrical power distribution system 100. The distribution system 100 includes a first power grid 110, a second power grid 130, and a control system 170. The first power grid 110 and the second power grid 130 may be operated autonomously in a separated or islanded state, or the first power grid 110 and the second power grid 130 may be operated in a grid-tied or electrically connected state.

The ability of the first power grid 110 and the second power grid 130 to operate in the islanded state or the grid-tied state improves the performance of the distribution system 100. For example, under ordinary operating conditions, the first power grid 110 and the second power grid 130 are electrically connected and provide electrical power to each other. When a fault or scheduled maintenance occurs the grid 130, the grid 130 is no longer able to provide electrical power to its loads. However, in this situation, the grid 110 can separate from the grid 130 and can continue to provide power to its loads in the islanded state. Thus, fewer customers experience a service interruption because the grid 110 is still able to provide electrical power to its own loads. When the fault is cleared or the maintenance ends in the grid 130, service is restored in the grid 130, and the grids 110 and 130 are re-connected to resume operation together.

However, while in the islanded state, an AC voltage 111 at a node 150a in the first power grid 110 may become unsynchronized from an AC voltage 131 at a node 150b in the second power grid. In other words, characteristics (for example, amplitude, frequency, and phase angle) of the AC voltage 111 and the AC voltage 131 may deviate from each other when the grids 110 and 113 are not in the grid-tied state. The control system 170 synchronizes the characteristics of the AC voltage 111 in the first power grid 110 to the characteristics of the AC voltage 131 in the second power grid 130 before the first power grid 110 and the second power grid 130 are electrically connected to each other at a point of interconnection 150. Synchronizing the characteristics of the AC voltage 111 with those of the AC voltage 131 ensures that the first power grid 110 and the second power grid 130 can be electrically connected in a seamless, safe, and efficient manner.

The first power grid 110 includes a source system 112 that generates AC electrical power. The source system 112 includes a first dispatchable energy source 115a and a second dispatchable energy source 115b. As discussed in greater detail below, the control system 170 controls the first dispatchable energy source 115a in a V-f mode to control the amplitude and frequency of the electrical power produced by the first dispatchable energy source 115a to thereby control the amplitude and frequency of the AC voltage 111. The control system 170 also controls the second dispatchable energy source 115b in a PQ mode to control the real (or active) power and imaginary (or reactive) power produced by the second dispatchable energy source 115b to thereby control the phase angle of the AC voltage 111.

The distribution system 100 also includes a switching apparatus 152 that is electrically connected to the node 150a in the first power grid 110 and to the node 150b in the second power grid 130. The switching apparatus 152 has at least two states: a first state in which the node 150a and the node 150b are not electrically connected to each other (FIG. 1A), and a second state in which the switching apparatus 152 electrically connects the node 150a and the node 150b (FIG. 1B). The switching apparatus 152 is any device that is capable of electrically connecting and separating the nodes 150a and 150b. For example, the switching apparatus 152 may be any type of switchgear, including a breaker, recloser, disconnect, sectionalizer, or automated switch. The switching apparatus 152 may be used in any type of power system switchgear or other switching device and may be used in low-voltage (for example, up to 1 kV), medium-voltage or distribution voltage (for example, between 1 kV and 35 kV), and high-voltage (for example, 35 kV and greater) power systems. The voltage ranges provided for low-voltage, medium-voltage, distribution voltage, and high-voltage are provided as examples, and the switching apparatus 152 may be used in a system that has an operating voltage in one of the provided ranges even if the operating voltage is referred to by a different term.

The switching apparatus 152 is associated with a switch operation time, which is the amount of time that it takes for the switching apparatus 152 to transition from the first state to the second state. In other words, the switch operation time is the amount of time required for the switching apparatus 152 to electrically connect the first power grid 110 and the second power grid 130 after being commanded or triggered to do so.

The switching apparatus 152 is in the first state in FIG. 1A, and the switching apparatus 152 is in the second state in FIG. 1B. Thus, FIG. 1A shows the first power grid 110 and the second power grid 130 in the separated or islanded state in which the first power grid 110 and the second power grid 130 are not electrically connected to each other. In the islanded state, the grids 110 and 130 operate independently of each other. The grid 110 delivers electrical power from the source system 112 to one or more loads 114 via a distribution path 120. The grid 130 delivers electrical power from an energy source 132 to one or more loads 134. The energy source 132 is any type of source that produces AC electrical power, and may include more than one source and may include more than one type of source. The loads 114 and 134 are any type of device, machine, process, and/or sub-system that uses the AC electricity provided by the respective power grids 110 and 130.

FIG. 1B shows the distribution system 100 when the switching apparatus 152 is in the second state. Thus, FIG. 1B shows the first power grid 110 and the second power grid 130 in a connected state or a grid-tied state. The nodes 150a and 150b are electrically connected to each other at the point of interconnection 150. The AC voltage is the same at the node 150a and the node 150b.

The control system 170 is configured to monitor and control the characteristics of the AC voltage 111. For example, prior to electrically connecting the grid 110 and the grid 130, the control system 170 may adjust the amplitude, frequency, and phase angle in the grid 110 such that the characteristics of the AC voltage 111 and the AC voltage 131 are the same or are different by an amount that is acceptable for the operating conditions prior to electrically connecting the grid 110 and the grid 130.

Adjusting the characteristics to be equal or within a threshold difference is referred to as synchronization. By synchronizing the characteristics of the AC voltage 111 to the AC voltage 131, the control system 170 improves the performance of the electrical distribution system 100. For example, inrush currents may be produced if the switching apparatus 152 electrically connects the first power grid 110 and the second power grid 130 when there is a relatively large difference between the phase angle of the AC voltage 111 and the phase angle of the AC voltage 131. The inrush currents may damage components in the distribution system 100 and/or cause instability in the grid 110 and/or the grid 130. Some prior systems synchronize the amplitude and frequency of the AC voltages in the independent grids before electrically connecting the independent grids to each other. However, synchronizing only the amplitude and frequency of the AC voltages generally does not synchronize the phase angle of the AC voltages or does not synchronize the phase angle of the AC voltages for a sufficiently long period of time to allow a switching apparatus to electrically connect the grids. During the closing time of the switching apparatus, the conditions in grid 130 can significantly change such that the characteristics of the voltage can deviate, causing damage to the equipment in the grids.

On the other hand, the control system 170 synchronizes the phase angle of the AC voltage 111 to the phase angle of the AC voltage 131 such that the first power grid 110 and the second power grid 130 can be electrically connected without generating excessive inrush currents or without generating inrush currents at all. Moreover, the control system 170 maintains the synchronization of the phase angles for a period of time that is greater than or equal to the switch operation time of the switching apparatus 152. This allows the switching apparatus 152 to transition to the second state while the phase angle of the AC voltage 111 and the phase angle of the AC voltage 131 are synchronized. This also allows a wider range of devices to be used as the switching apparatus 152. For example, because the control system 170 maintains the synchronization for a period of time, a switching apparatus with a relatively long switching operation time may be used with the control system 170.

The electrical power distribution system 100 may have an operating voltage of, for example, up to 480 volts (V), up to 600 V, up to 1 kilovolt (kV), up to 12 kV, up to 34.5 kV, up to 38 kV, or 69 kV or higher, and may operate at a system frequency of, for example, 50 Hertz (Hz) or 60 Hz. The electrical power distribution system 100 may be a single-phase system or may be a multi-phase system. For example, the electrical power distribution system 100 may be a three-phase distribution system 100. In implementations in which the distribution system 100 is a three-phase system, the AC voltage 111 and the AC voltage 131 are three-phase voltages. In examples in which the distribution system 100 is a multi-phase system, the control system 170 synchronizes the characteristics of each phase prior to the first power grid 110 and the second power grid 130 being electrically connected.

The discussion above is an example that relates to synchronizing the characteristics of the AC voltage 111 to the characteristics of the AC voltage 131. In other examples, the control system 170 (and/or a separate control system similar to the control system 170) and dispatchable energy sources similar to the first and second dispatchable energy sources 115a and 115b are associated with the second power grid 130. For example, the energy source 132 may include two dispatchable energy sources. In these other examples, the characteristics of the AC voltage 131 are synchronized with the characteristics of the AC voltage 111. Furthermore, in some implementations in which the first power grid 110 and the second power grid 130 are configured such that the electrical characteristics of the AC voltage 111 and the AC voltage 131 are both controllable, the control system 170 controls aspects of the first power grid 110 and the second power grid 130 to adjust the characteristics of the AC voltage 111 and the AC voltage 113 such that the AC voltages 111 and 113 are synchronized before the control system 170 connects the grids 110 and 130 at the point of interconnection 150. Moreover, after the first power grid 110 and the second power grid 130 are electrically connected at the point of interconnection 150 into a joined grid, the control system 170 may be used to synchronize the joined grid with another power grid (not shown) such that the joined grid is electrically connected to yet another power grid.

Figure 2:
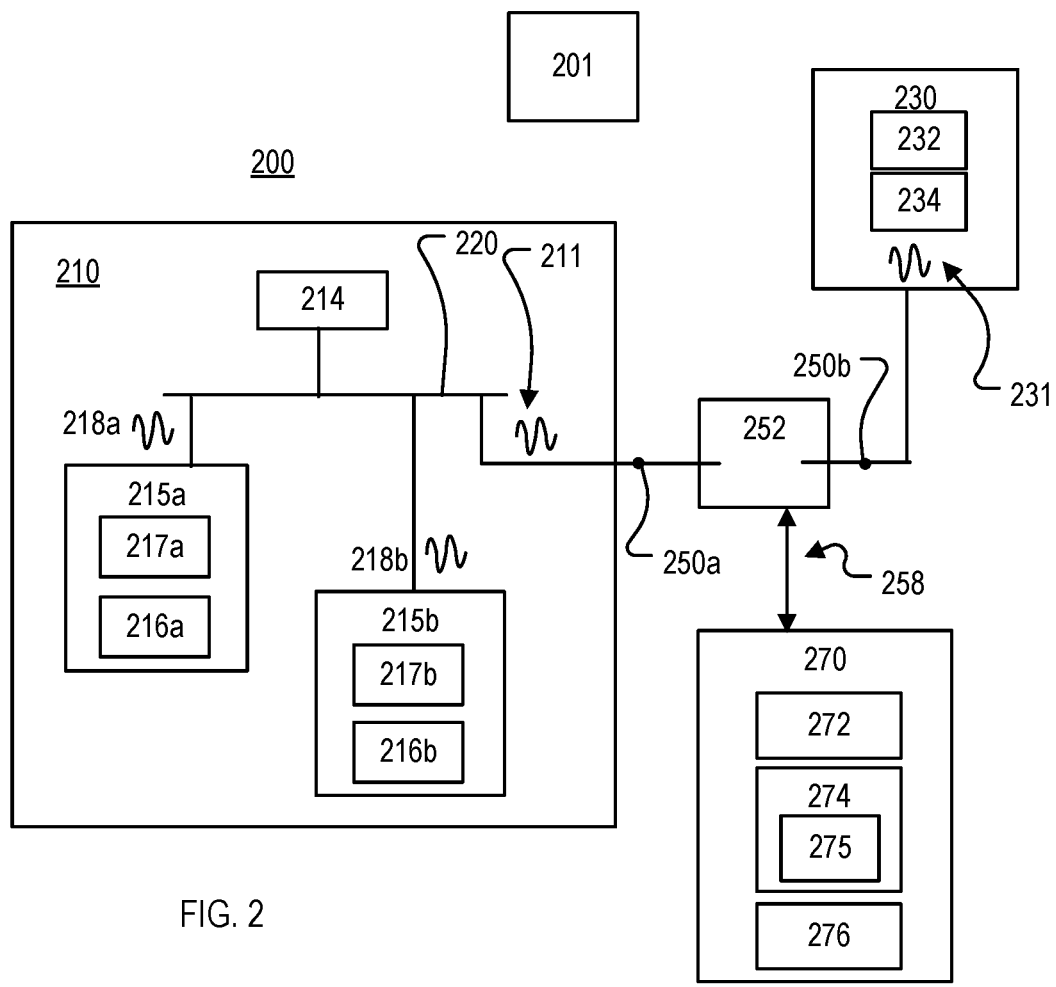
FIG. 2 is a block diagram of another example of an AC electrical power distribution system.

FIG. 2 is a block diagram of an example of an AC electrical power distribution system 200. The electrical power distribution system 200 includes a first power grid 210 and a second power grid 230. Each of the first power grid 210 and the second power grid 230 is any type of power grid that can operate independently or electrically connected to another power grid. The first power grid 210 may be, for example, a microgrid. The second power grid 230 may be a medium-voltage utility grid, a macrogrid, or another microgrid. A microgrid is a localized group of sources of electricity and loads. A macrogrid is a larger group of sources and loads that serves a relatively large geographical area.

The first power grid 210 includes a first dispatchable energy source 215a, a second dispatchable energy source 215b, and loads 214, all of which are electrically connected to a distribution path 220. The distribution path 220 is any type of electrically conductive connection, such as, for example, transmission lines or metal wires. Electrical power is distributed from the dispatchable energy sources 215a and 215b to the loads 214 via the distribution path 220. A dispatchable energy source is an energy source that can be turned on or off, and the characteristics (for example, amplitude, frequency, and/or phase) of the electrical power produced by a dispatchable energy source are controllable. Examples of energy sources that may be used as the dispatchable energy sources 215a and 215b include rotational generators (for example, diesel generators, natural gas generators, combined heat power (CHP) generators); geothermal generators; biomass generators; and inverter-based power sources, such as a battery or a fuel cell that is associated with an inverter, just to name a few. A microgrid that includes one or more dispatchable energy sources is itself a dispatchable energy source. In other words, a microgrid may be considered to be a dispatchable energy source. Furthermore, any type of power grid that is not necessarily a microgrid may be considered to be a dispatchable energy source if the electrical characteristics of the electrical power generated by that power grid are controllable. The dispatchable energy source 215a and/or 215b also may be a dispatchable distributed energy resource (DER). A DER is any type of source of electricity that is capable of providing localized power. DERs may be distributed throughout the first power grid 210 and thus may be located relatively close to a particular load. The amount of energy generated by a DER is generally less than a traditional, centralized power source. For example a DER may generate 1 kiloWatt (kW) to 10,000 kW of electricity. The energy sources 215a and 215b are not necessarily the same type of or kind of dispatchable energy source. For example, the first dispatchable energy source 215a may be a generator, and the second dispatchable energy source 215b may be a battery or other energy source that stores electrical energy and is associated with an inverter that converts direct current (DC) electrical power to AC power.

The first power grid 210 may include additional energy sources. The additional energy sources may be any type of energy source, including dispatchable or non-dispatchable sources. A non-dispatchable energy source is an energy source that produces an amount of energy that is not directly controllable. Examples of non-dispatchable sources include solar systems and wind systems. For example, the amount of electricity generated by an array of photovoltaic (PV) devices that convert sunlight into electricity is expected to be fairly constant during a sunny day, but drops quickly when a cloud comes between the PV device and the sun, and the amount of generated electricity may rise quickly a short time later when the cloud moves away and is no longer between the PV device and the sun. In this way, the array of PV devices cannot dispatch real power. However, PV devices can dispatch reactive power.

The second power grid 230 includes a source 232, which may be any type of source of electricity and may include more than one source, and loads 234. The source 232 may include one or more dispatchable energy sources.

The electrical power distribution system also includes a control system 270. The control system 270 controls the first dispatchable energy source 215a and the second dispatchable energy source 215b to synchronize an AC voltage 211 at a node 250a with an AC voltage 231 at a node 250b prior to electrically connecting the first power grid 210 and the second power grid 230. The control system 270 controls the first dispatchable energy source 215a to synchronize the amplitude and frequency of the AC voltage 211 with the amplitude and frequency of the AC voltage 231. The control system 270 controls the second dispatchable energy source 215b to synchronize the phase angle of the AC voltage 211 with the phase angle of the AC voltage 231. In implementations in which the second power grid 230 includes dispatchable energy sources, the control system 270 may be configured to control the dispatchable energy sources in the second power grid 230 to synchronize the phase angle of the AC voltage 231 such that the AC voltage 211 is synchronized with the phase angle of the AC voltage 231. Moreover, the control system 270 may be configured to control dispatchable energy sources in the second power grid 230 and the first power grid 210 to control the phase angle of the AC voltage 211 and the AC voltage 231.

The distribution system 200 also includes a switching apparatus 252 that has at least a first state and a second state. When the switching apparatus 252 is in the first state, the nodes 250a and 250b are disconnected. When the switching apparatus 252 is in the second state, the switching apparatus 252 connects the node 250a to the node 250b at a point of interconnection.

Figure 3:
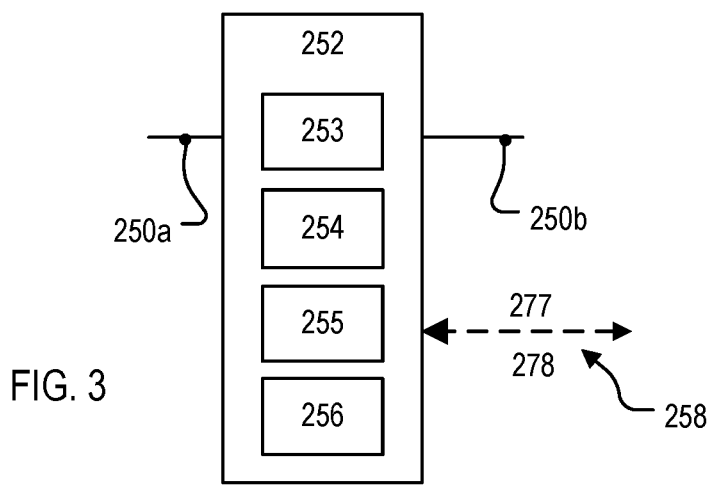
FIG. 3 is a block diagram of an example configuration of a switching apparatus.

Referring also to FIG. 3, a block diagram of an example configuration of the switching apparatus 252 is shown. The switching apparatus 252 is any apparatus that is capable of disconnecting and connecting the nodes 250a and 250b. The apparatus 252 may be, for example, any type of switchgear, including a breaker, recloser, disconnect, sectionalizer, or automated switch.

In the example of FIG. 3, the apparatus 252 includes electrically conductive contacts 253, a driving module 254, and a communications interface 255 for receiving data from and/or sending data to a control system such as the control system 170 (FIG. 1) or the control system 270 (FIG. 2). The switching apparatus 252 and the control system 270 are coupled by a data connection 258. The data connection 258 is any medium capable of transmitting data and information. For example, the data connection 258 may be an electrical cable or a wireless data connection. The switching apparatus 252 and the control system 270 are shown as separate units in FIG. 2. In some implementations, the switching apparatus 252 is integrated with a control system 270 in a single unit.

To open and/or close the contacts 253, one or more of the contacts 253 is moved by the driving module 254. The driving module 254 may include electrical and/or mechanical components that drive the contacts 253 to open and close. For example, the driving module 254 may include electronics, springs, motors, actuators, and mechanical linkages that operate to cause one or more of the contacts 253 to move to connect the contacts 253 to each other or disconnect the contacts 253 from each other. The opening and/or closing of the contacts 253 may be initiated by a switching apparatus command signal 277 that is generated by the control system 270, provided over the data connection 258, and received at the communications interface 255. The switching apparatus command signal 277 includes information and/or data that is sufficient to trigger the opening or closing of the contacts 253 when provided to the switching apparatus 252.

When the contacts 253 are connected to each other or closed, the nodes 250a and 250b are electrically connected and form a point of interconnection, and the first power grid 210 and the second power grid 230 are electrically connected to each other. When the contacts 253 are disconnected from each other or opened (as shown in FIG. 2), current does not flow between the nodes 250a and 250b, and the first and second power grids 210 and 230 are not electrically connected to each other.

The switching apparatus 252 also includes a data module 256, which measures or extracts environmental information and/or diagnostic information and generates data 278. For example, the data module 256 may include sensors that monitor the voltage and/or current at the node 250a and the node 250b. The AC voltage 211 at the node 250a and/or the AC voltage 231 at the node 250b may be measured by sensors in the data module 256. In another example, the data module 256 may include sensors that measure environmental information, such as temperature, humidity, air quality, and/or air pressure in the vicinity of the switching apparatus 252. In these implementations, the data module 256 may include one or more environmental sensors such as, for example, a thermometer, a moisture monitor, a barometer, or any other environmental sensor. The data module 256 also may include one or more diagnostic sensors or measurement devices such as a health monitor, a monitor that tracks the total time in which the switching apparatus 252 has been deployed, and/or a monitor that tracks the number of times the switching apparatus 252 has operated.

Referring again to FIG. 2, the control system 270 includes an electronic processing module 272, an electronic storage 274, and an input/output (I/O) interface 276. The electronic processing module 272 includes one or more electronic processors. The electronic processors of the module 272 may be any type of electronic processor and may or may not include a general purpose central processing unit (CPU), a graphics processing unit (GPU), a microcontroller, a field-programmable gate array (FPGA), Complex Programmable Logic Device (CPLD), and/or an application-specific integrated circuit (ASIC).

The electronic storage 274 may be any type of electronic memory that is capable of storing data, and the electronic storage 274 may include volatile and/or non-volatile components. The electronic storage 274 and the processing module 272 are coupled such that the processing module 272 may access or read data from the electronic storage 274 and may write data to the electronic storage 274. The electronic storage 274 stores a synchronization module 275 in the form of, for example, machine-readable instructions, a computer program, or software, that, when executed by the processing module 272, synchronize the characteristics of the AC voltage 211 with the characteristics of the AC voltage 231 through a process such as discussed with respect to FIG. 6. The electronic storage 274 also may store data received from the switching apparatus 252. For example, the electronic storage 274 may store data 278 produced by the data module 256.

The I/O interface 276 is any interface that allows a human operator and/or an autonomous process to interact with the control system 270. The I/O interface 276 also allows the control system 270 to communicate with the switching apparatus 252, and with devices in the power grid 210 and the power grid 230. For example, the control system 270 may send commands to the first dispatchable energy source 215a, the second dispatchable energy source 215b, the switching apparatus 252, dispatchable energy sources in power grids other than the first power grid 210, and/or from other components, sensors, and/or devices through the I/O interface 276. The control system 270 may receive data and information from the first dispatchable energy source 215a, the second dispatchable energy source 215b, dispatchable energy sources in power grids other than the first power grid 210 and/or the switching apparatus 252 through the I/O interface 276. For example, the control system 270 may receive measurements and data 278 related to the voltage of the AC voltage 211 and the AC voltage 231 from the data module 256 via the I/O interface 276.

The I/O interface 276 may include, for example, a display, a keyboard, audio input and/or output (such as speakers and/or a microphone), a serial or parallel port, a Universal Serial Bus (USB) connection, and/or any type of network interface, such as, for example, Ethernet. The I/O interface 276 also may allow communication without physical contact through, for example, an IEEE 802.11, Bluetooth, or a near-field communication (NFC) connection. The control system 270 may be, for example, operated, configured, modified, or updated through the I/O interface 276.

The I/O interface 276 also may allow the control system 270 to communicate with systems external to and remote from the system 200. For example, the I/O interface 276 may include a communications interface that allows communication between the control system 270 and a remote station 201 using, for example, the Supervisory Control and Data Acquisition (SCADA) protocol or another services protocol. The remote station 201 may be any type of station through which an operator is able to communicate with the control system 270 without making physical contact with the control system 270. For example, the remote station 201 may be a computer-based work station, a smart phone, tablet, or a laptop computer that connects to the control system 270 via a services protocol, or a remote control that connects to the control system 270 via a radio-frequency signal.

Each of the dispatchable energy sources 215a and 215b includes a respective associated local control system 216a and 216b, and a respective associated power generation device 217a and 217b. The power generation device 217a produces an AC voltage 218a under the control of the local control system 216a. The power generation device 217b produces an AC voltage 218b under the control of the local control system 216b. Each of the local control systems 216a and 216b may include an electronic processor, an electronic storage, and a communications interface. The local control systems 216a and 216b communicate with the control system 270. For example, the local control systems 216a and 216b receive command signals from the control system 270.

Each of the power generation devices 217a and 217b is any type of device capable of being controlled to produce electricity in an on-demand manner as specified by the respective local control system 216a and 216b. For example, the dispatchable energy source 215a may be a generator. In these implementations, the power generation device 217a includes a moving element that converts motive energy into AC electrical energy (the AC voltage 218a). In another example, the dispatchable energy source 215a is a battery or other source of DC power that is associated with an inverter. In these implementations, the power generation device 217a is a capacitor or other energy storage device and an inverter, where the local control system 216b controls the energy storage device and the inverter such that the battery produces AC electrical energy (the AC voltage 218b) having particular characteristics.

Figure 4:
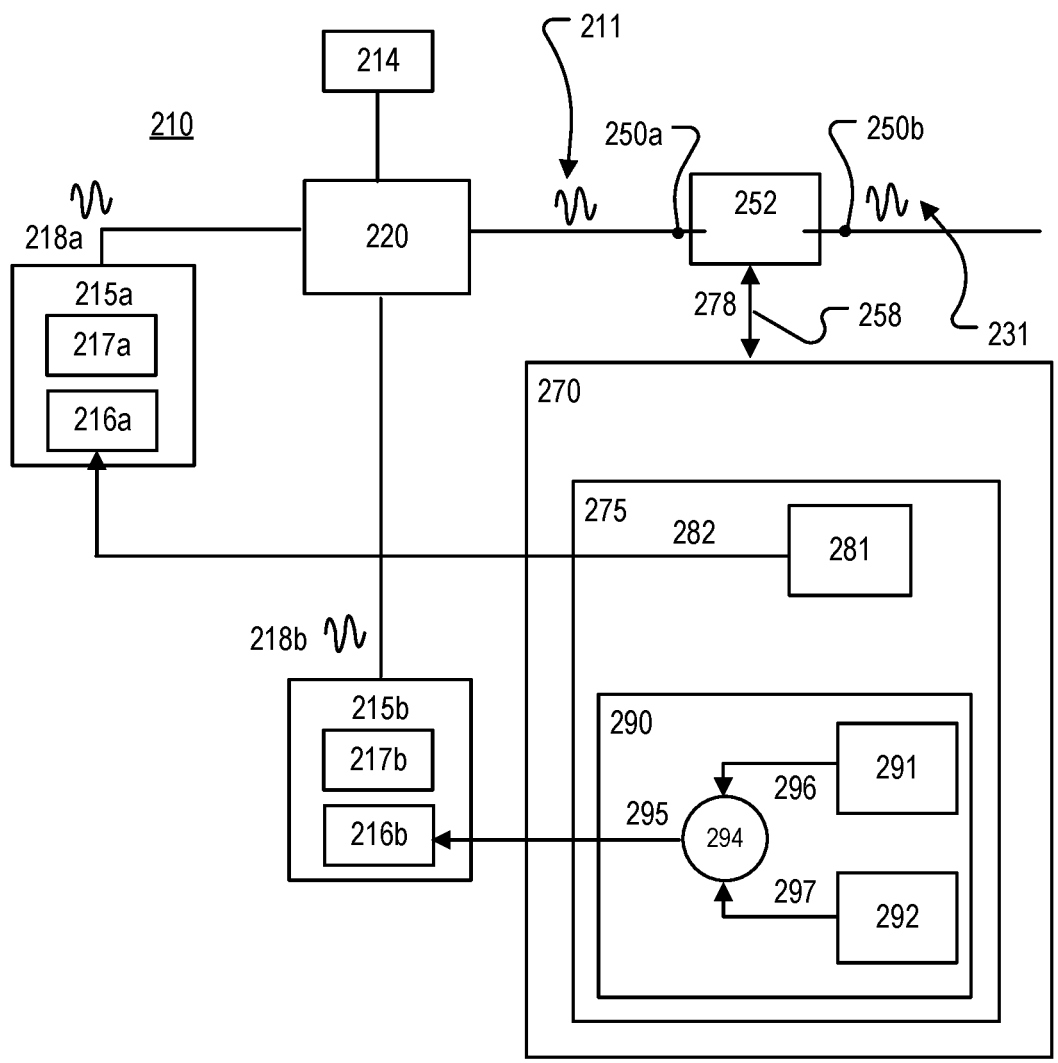
FIG. 4 is a block diagram of an example of a synchronization module.

FIG. 4 shows a block diagram of the synchronization module 275 and the first power grid 210. In the example of FIG. 4, the first power grid 210 is operating in the islanded state. The node 250a and the node 250b are not electrically connected to each other. The synchronization module 275 includes a voltage and frequency control module 281, and an active control module 290. The synchronization module 275 receives data 278 from the switching apparatus 252. The data 278 includes, for example, values that represent the amplitude, frequency, and phase angle of the AC voltage 211 at the node 250a and the amplitude, frequency, and phase angle of the AC voltage 231 at the node 250b.

The voltage and frequency control module 281 controls the first dispatchable energy source 215a in a voltage-frequency (V-f) mode. The voltage and frequency control module 281 produces a first command signal 282 that is provided to the local control system 216a. The first command signal 282 includes a voltage command (v*) and a frequency command (f*). The voltage command (v*) is a value that specifies a target amplitude for the voltage 218a. The frequency command (f*) is a value that specifies a target frequency for the frequency of the voltage 218a. The voltage 211 is a superposition of the voltage 218a and the voltage 218b. Thus, by changing the amplitude and frequency of the voltage 218a, the amplitude and frequency of the voltage 211 is also changed.

When provided to the local control system 216a, the command signal 282 causes the local control system 216a to control the power generation devices 217a in a manner that changes the amplitude and frequency of the AC voltage 218a to the values indicated by the command signal 282. The first dispatchable energy source 215a is any grid-forming source. For example, the first dispatchable energy source 215a may be a diesel generator, and the power generation device 217a includes a rotating element. In these implementations, the local control system 216a increases the speed at which the rotating element rotates to increase the frequency of the AC voltage 218a and decreases the speed at which the rotating element rotates to decrease the frequency of the AC voltage 218a. In another example, the first dispatchable energy source 215a is a battery that is associated with an inverter that converts DC voltage stored in the battery to the AC voltage 218a. In this example, the inverter is controlled based on the control signal 282 to change the magnitude and/or frequency of the voltage 218a to the target amplitude and target frequency.

The active control module 290 controls the second dispatchable energy source 215b in a PQ control mode to control the real and reactive power output of the second dispatchable energy source 215b. The active control module 290 produces a second command signal 295, which is provided to the local control system 216b. In the PQ control mode, the second dispatchable energy source 215b is commanded by the second command signal 295 to output a target real power or a target reactive power into the first power grid 210. Some types of sources, such as diesel generators and PV sources, are unable to provide negative real power into the first power grid 210 whereas other types of sources (such as a battery with an associated inverter) can inject negative real power into the first power grid 210. All types of sources are able to dispatch positive and negative values of reactive power into the first power grid 210.

The second command signal 295 includes information that specifies the target real and reactive power to be produced by the power generation device 217b. As noted above, the voltage 211 is a superposition of the voltage 218a and the voltage 218b. By controlling the real and reactive power output by the power generation device 217b, the phase angle of the AC voltage 211 is also controlled.

The active control module 290 includes an angle control module 291. The angle control module 291 is a lag-lead compensator that produces an output 296. In the implementation shown in FIG. 4, the active control module 290 also includes a smoothing control module 292 (which also may be referred to as a damping control module 292) and an adder module 294. The smoothing control module 292 produces an output 297. The smoothing control module 292 acts to damp oscillations in the output of the first dispatchable energy source 215a. In implementations that include the smoothing control module 292 (such as shown in FIG. 4), the outputs 296 and 297 are summed at the adder module 294 to produce the second command signal 295. The command signal 295 controls and can change the real and reactive power produced by the power generation device 217b. Changing the real and reactive power output by the second dispatchable energy source 215b may interfere with the AC power produced by the first dispatchable energy source 215a. The smoothing control module 292 adjusts the output of the second dispatchable energy source 215b such that the effect on the AC power produced by the first dispatchable energy source 215a is reduced or eliminated.

The active control module 290 may be implemented with just the angle control module 291 and without the smoothing control module 292. In these implementations, the output 296 is the command signal 295 and the active control module 290 does not include the adder module 294.

Figure 5:
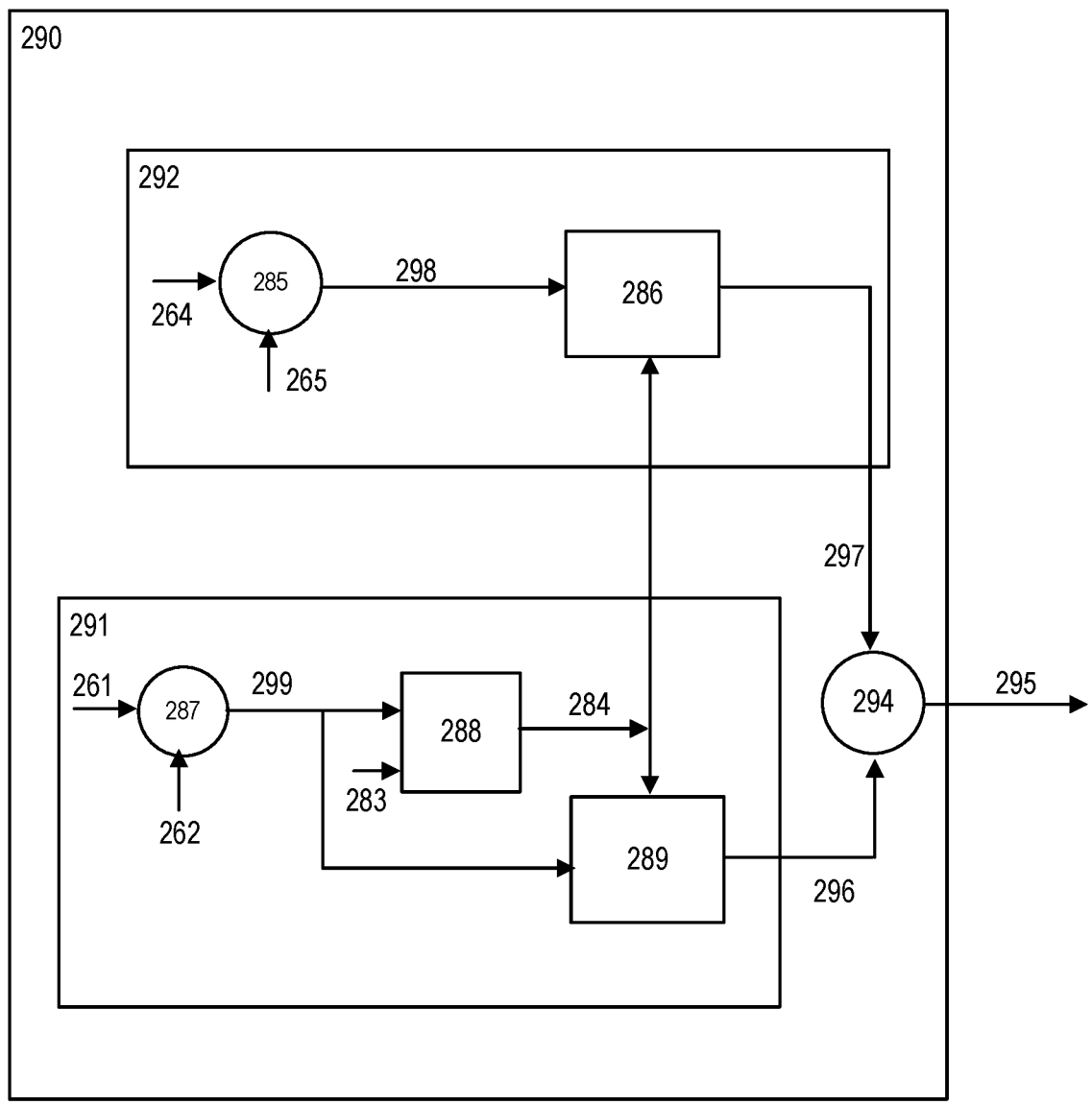
FIG. 5 is a block diagram of an example of an active control module.

FIG. 5 is a block diagram of an implementation of the active control module 290 that includes the angle control module 291 and the smoothing control module 292. The angle control module 291 includes a difference module 287. The difference module 287 determines a phase difference 299. The phase difference 299 is the difference between a phase angle 261, which is a measured phase angle of the AC voltage 231 in the second power grid 230, and a phase angle 262, which is a measured phase angle of the AC voltage 211 in the first power grid 210. The phase angles 261 and 262 may be measured by the data module 256 of the switching apparatus 252 and provided to the control system 270 as part of the data 278. The phase difference 299 is provided as an input to a lag-lead compensator module 289. The lag-lead compensator 289 has a transfer function in the LaPlace domain as shown in Equation 1:

$$G\frac{1+sT_1}{1+sT_2}, \quad \text{Equation (1)}$$

where G is the gain of the lag-lead compensator module 289, s is the complex frequency, and T1 and T2 are tuning parameters of the compensator module 289 and each have a value that is greater than zero. T1 and T2 introduces the pole-zero pair into the transfer function shown in Equation (1), where 1/T1 represents the zero frequency and 1/T2 represents the pole frequency. The output of the lag-lead compensator module 289 is the output 296, which is provided to the adder module 294.

The smoothing control module 292 includes a difference module 285. The difference module 285 determines a difference between a measured value 264, which is a measured value of the AC power output of the power generation device 217a, and a measured value 265, which is a measured value of the AC power output of the power generation device 217a at an earlier time (such as the start of the synchronization process discussed with respect to FIG. 6). The measured values 264 and 265 may be obtained from a sensor that is at the output of the first dispatchable energy source 215a. The sensor may be a power sensor or a collection of sensors that produce data from which the AC power output of 217a can be derived. For example, the sensor may be a sensor system that includes a voltage sensor and a current sensor. The difference module 285 produces an output 298, which is the difference between the measured value 264 and the measured value 265.

The output 298 is the input to a proportional-integrator (PI) control module 286. The PI control module 286 has a transfer function in the LaPlace domain as shown in Equation 2:

$$K_P + \frac{K_i}{s}, \quad \text{Equation (2)}$$

where s is the complex frequency, Kp is the proportional gain, and Ki is the integral gain. Kp and Ki are tuning parameters. The output of the PI control module 286 is the output 297, which is provided to the adder module 294. The output 297 and the output 296 of the lag-lead compensator module 289 are summed at the adder module 294 to generate the second command signal 295.

The second command signal 295 includes an active power command (P*) and a reactive power command (Q*) that are provided to the local control system 216b of the second dispatchable energy source 215b. The local control system 216b controls the power generation device 217b based on the active power command (P*) and the reactive power command (Q*) to control the active and reactive power output of the second dispatchable energy source 215b.

The active control module 290 also includes a comparator 288. The comparator 288 is configured to compare the phase difference 299 (which is the difference between the phase angle of the AC voltage 211 and the AC voltage 231) to a reference difference 283. The comparator 288 produces an output 284. The output 284 has a first value (for example, 1) if the phase difference 299 is greater than the reference difference 283, and a second value (for example, 0), if the phase difference 299 is equal to or less than the reference difference 283.

If the output 284 has the first value (that is, if the phase difference 299 is greater than the reference difference 283), the PI control module 286 and the lag-lead compensator module 289 are reset and the outputs of the PI control module 286 and the lag-lead compensator 289 are set to zero. This also means that the PI control module 286 and the lag-lead compensator 289 are disabled when output 284 has the first value. In other words, the PI control module 286 and the lag-lead compensator 289 do not perform the control function when the phase difference 299 is greater than the reference difference 293.

The reference difference 283 is a pre-determined value that is stored on the electronic storage 274. The value of the reference difference 283 may be set to a value that results in the PI control module 286 and the lag-lead compensator 289 to be disabled when the phase difference 299 is such that the amount of control action needed to bring the phase difference 299 to zero or to within specification is too great and could cause instabilities.

The first dispatchable energy source 215a is controlled by the control signal 282 to maintain a small frequency difference (or slip) between the AC voltage 211 and the AC voltage 231. The frequency difference may be such that the phase angle difference 299 over time can be modeled as a clockwise rotating phasor in a Cartesian coordinate system. In other words, the frequency difference or slip between the AC voltage 211 and the AC voltage 231 is such that the phase angle difference 299 increases from 0° to 360° over time. The phasor that represents the phase angle difference 299 is in the first quadrant when the phase difference 299 is between 0° and 90°. The phasor is in the fourth quadrant when the phase difference 299 is between 0° and 270°, the phasor is in the third quadrant when the phase difference 299 is between 270° and 180°, and the phasor is in the second quadrant when the phase difference 299 is between 180° and 90°. The reference difference 283 may be, for example, an angle value that is in the third quadrant.

Because the phasor rotates clockwise due to the control of the frequency difference (or slip) between the AC voltage 211 and the AC voltage 231, when the phase difference 299 is greater than the reference difference 283, it is generally more efficient to allow the phasor that represents the phase difference 299 to continue to rotate clockwise into the first quadrant (by allowing the phase difference between the AC voltage 211 and the AC voltage 231 to continue to increase) rather than to attempt to actively control the phase difference 299. By setting the reference difference 283 to an angle that is in, for example, the third quadrant, and by maintaining the frequency difference between the AC voltage 211 and the AC voltage 231 such that the phasor rotates in a clockwise manner, the active control module 270 avoids compensating for a relatively large values of the phase angle difference 299. The active control module 270 instead allows the phase difference 299 to continue to progress in the clockwise direction and then compensates for the phase angle difference 299 in the first quadrant. This approach may improve the efficiency of the active control module 270.

As discussed above, the active control module 275 does not necessarily include the smoothing control module 292. In implementations in which the active control module 270 includes only the angle control module 291, the output 284 from the comparator 288 is provided to the lag-lead compensator 289 only and only resets the lag-lead compensator 289 (because the smoothing control module 292 is not included in such an implementation). Moreover, the active control module 270 may be implemented without the comparator 288 such that the active control of the phase difference 299 occurs regardless of the value of the phase difference 299.

In summary, the active control module 275 controls the phase angle difference 299 to be zero or to be within a specified acceptable range (for example, +/−10°). The active control module 275 produces the command signal 282, which controls the first dispatchable energy source 215a in V-f mode. The command signal 282, for example, controls the frequency of the AC voltage 218a produced by the first dispatchable energy source 215a to thereby control the frequency of the AC voltage 211. In this way, the active control module 275 can be used to control the frequency difference (or slip) between the AC voltage 211 and the AC voltage 231. The frequency difference may be controlled to be relatively small, for example, about 0.01 Hz or less.

The active control module 275 also produces the command signal 295, which controls the second dispatchable energy source 215b in PQ mode. The command signal 295 controls the real and/or reactive power produced by the second dispatchable energy source 215b to thereby control the phase difference 299 between the AC voltage 211 and the AC voltage 231. For example, if the value of the phase difference 299 is greater than the acceptable phase difference but is less than 90° (the phase difference 299 is in the first quadrant), the command signal 295 causes the second dispatchable energy source 215b to inject power into the first power grid 210 to cause the phasor that represents the phase difference 299 to move in the clockwise direction toward zero. If the value of the phase difference 299 is greater than the acceptable phase difference but is less than zero (for example, the phasor that represents the phase difference 299 is in the fourth quadrant), the command signal 295 causes the second dispatchable energy source 215b to remove power from the first power grid 210 to cause the phasor to move toward zero.

Other implementations of the active control module 290 are possible. For example, the active control module 290 may include a feedback path or predictor model that uses data collected from the first grid 210 to tune the parameters G, kp, and/or ki. The performance of the angle control module 291 is dependent on the dynamic characteristics of the first power grid 210, which might shift due to change in number and/or type of sources, load level, and/or various other changes. Correspondingly, the parameters G, kp, and/or ki may be tuned manually to ensure optimal performance of the angle control module 291. Alternatively, a learning algorithm may be used to tune these parameters directly from online system behavior. For example, feedback obtained from the first power grid 210 (for example, the change in phase angle at the point of interconnection 250 due to a certain control action, such as the power output from the second dispatchable energy source 215b) may be fed into a predictor module. The predictor module based on historical control behavior sets the parameters G, kp, and/or ki in real time for each set or instance configuration of the first power grid 210. The configuration may be or depend on the number of dispatchabvle energy sources active at the time and/or number inertial sources active at the time. Accounting for changes in configuration allows optimal performance or improved performance of the control module 291 under changing circumstances and/or changing configurations of the first power grid 210.

Furthermore, the above examples are discussed with respect to the first and second dispatchable energy sources 215a and 215b. However, the synchronization module 275 may be implemented to control other dispatchable energy sources that are not associated with the first grid 210. For example, the synchronization module 275 may be implemented to control dispatchable energy sources in the second grid 230 or in other grids that are distinct from the first grid 210. Moreover, the synchronization module 275 and/or the active control module 290 may be implemented on a control system other than the control system 270.

Figure 6:
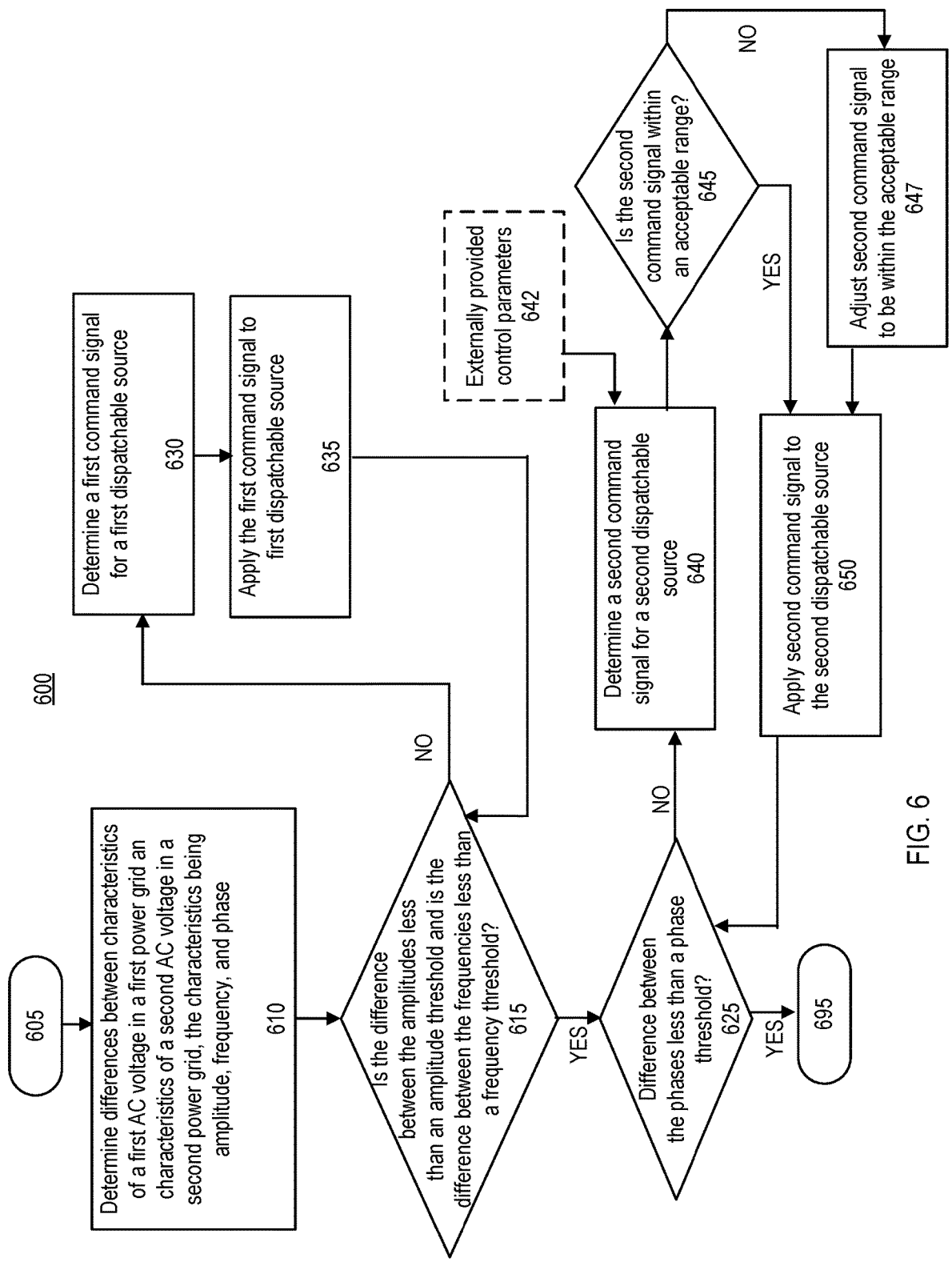
FIG. 6 is a flow chart of an example of a synchronization process.

FIG. 6 is a flow chart of a synchronization process 600. The synchronization process 600 is an example of a process to connect the first power grid 210 to the second power grid 230. The synchronization process 600 may be performed by the control system 270, for example, by one or more electronic processors in the processing module 272. Machine-implementable or computer-implementable instructions that implement the process 600 are stored on the electronic storage 274. The example discussed below relates to a configuration in which the dispatchable energy sources 215a and 215b are controlled to synchronize the AC voltage 211 to the AC voltage 231. However, the process 600 may be used to synchronized any power grids. For example, the process 600 may be used to synchronize the AC voltage 231 to the AC voltage 211 by controlling dispatchable energy sources in the second grid 230. Furthermore, the process 600 maybe used to synchronize the AC voltage 211 to the AC voltage 231 by controlling the dispatchable energy sources 214a and 214b in addition to controlling dispatchable energy sources in the second power grid 230.

The synchronization process 600 begins when a connection command is received at the control system 270 (605). The connection command may be received through the I/O interface 276 of the control system 270. The connection command is received at a time when the first power grid 210 and the second power grid 230 are operating separately and independently of each other. Thus, the characteristics of the AC voltage 211 and the AC voltage 231 may be different when the connection command is received. To safely and efficiently connect the first power grid 210 and the second power grid 230, the characteristics of the AC voltage 211 are synchronized to be the same or within a threshold difference of the AC voltage 231.

The connection command may be generated in response to conditions in the second power grid 230 returning to an expected operating condition after the occurrence of a fault or scheduled maintenance that caused the grids 210 and 230 to be disconnected. For example, the connection command may be generated in response to the clearing of a fault or the end of scheduled maintenance. The connection command may be generated by the remote station 201. For example, the connection command may be generated by an operator that is monitoring the first and second power grids 210 and 230 from the remote station 201 or by an automated process running at the remote station 201. The connection command also may be generated at the control system 270. For example, an operator may use the I/O interface 276 to manually trigger the connection command. In another example, the electronic storage 274 may store a computer program that analyzes the data 278 from the data module 256 of the switching apparatus 252, and the control system 270 automatically triggers the connection command based on the analysis.

Differences between the characteristics of the AC voltage 211 and the characteristics of the AC voltage 231 are determined (610). The characteristics are amplitude, frequency, and phase angle. The difference between the amplitude of the AC voltage 211 and the amplitude of the AC voltage 231 ($\Delta V$) is determined. The difference between the frequency of the AC voltage 211 and the frequency of the AC voltage 231 ($\Delta f$) is determined. The difference between the phase angle of the AC voltage 211 and the phase angle of the AC voltage 231 ($\Delta \varphi$) is determined. If the AC voltages 211 and 231 include more than one phase, the difference for each characteristic is determined for each phase. The differences may be determined at a particular time.

The amplitude difference ($\Delta V$) is compared to an amplitude threshold, the frequency difference ($\Delta f$) is compared to a frequency threshold, and the phase angle difference ($\Delta \varphi$) is compared to a phase angle threshold. The amplitude threshold, frequency threshold, and phase angle threshold may be stored on the electronic storage 274. The phase threshold may be, for example +/−10 degrees (°). In other words, if the absolute value of the phase angle difference is greater than 10°, the phase angle threshold is exceeded. The amplitude threshold may be, for example, +/−1% of the nominal or expected value of the difference between the amplitude of the AC voltage 211 and the amplitude of the AC voltage 231. The frequency threshold may be, for example, +/−0.1 Hz.

If the absolute value of the frequency difference is less than the frequency threshold, and if the absolute value of the amplitude difference is less than the amplitude threshold (615), the process 600 checks the phase angle difference (Δφ) relative to the phase angle threshold (625). If the absolute value of the phase angle difference (Δφ) is less than the phase angle threshold (625), the AC voltage 211 and the AC voltage 231 are already synchronized and the grids 210 and 230 are ready to be electrically connected. A switching apparatus command is issued (695). The switching apparatus command 277 is generated by the control system 270 and provided to the switching apparatus 252. The switching apparatus 252 transitions from the first state to the second state in response to receiving the switching apparatus command 277, thereby electrically connecting the first power grid 210 and the second power grid 230.

Returning to (615), if the absolute value of the amplitude difference (ΔV) is greater than the amplitude threshold and/or the absolute value of the frequency difference (Δf) is greater than the frequency threshold, the first command signal 282 for the first dispatchable energy source 215a is determined (630). The first command signal 282 is determined by the voltage and frequency control module 281 (FIG. 4). The voltage and frequency control module 281 controls the first dispatchable energy source 215a in the V-f mode. The first command signal 282 is applied to the first dispatchable energy source 215a (635). The first command signal 282 includes a target voltage amplitude (V*) and a target frequency (f*). The local control system 216a controls the power generation device 217a to adjust amplitude and frequency of the AC voltage 218a to be equal to or closer to the target voltage amplitude and target frequency.

After the first command signal 282 is applied to the first dispatchable energy source 215a, the difference between the amplitude of the AC voltage 211 and the amplitude of the AC voltage 231 (ΔV) and the difference between the frequency of the AC voltage 211 and the frequency of the AC voltage 231 (Δf) is again determined and compared to the respective amplitude and frequency thresholds. If the absolute value of the amplitude difference (ΔV) and the absolute value of the frequency difference (Δf) exceed the respective amplitude and frequency thresholds, (630) and (635) are repeated until the absolute value of the amplitude difference (ΔV) and the absolute value of the frequency difference (Δf) are less than the respective amplitude and frequency thresholds.

When the absolute values of the amplitude difference (ΔV) and the frequency difference (Δf) are less than the respective amplitude threshold and frequency threshold, the phase angle difference (Δφ) is compared to the phase angle threshold (625). If the absolute value of the phase angle difference (Δφ) is greater than the phase angle threshold, the second command signal 295 is generated for the second dispatchable energy source 215b (640). The command signal 295 is generated by the active control module 290. The command signal 295 controls the second dispatchable energy source 215b in the P-Q mode. The command signal 295 includes the P command (P*) that has a P value and the Q command (Q*) that has a Q value. The P command (P*) is a target real or active power for the second dispatchable energy source 215b to produce. The Q command (Q*) is a target reactive power for the second dispatchable energy source 215b to produce.

As discussed above, the active control module 290 includes the PI control module 286 and the lag-lead compensation module 289, both of which include several control parameters. For example, the PI control module 286 is associated with the proportional gain Kp and an integral gain Ki, and the lag-lead compensation module 289 is associated with a gain parameter G. These and other control parameters may be stored on the electronic storage 274. These and other control parameters may be set by the manufacturer of the control system 270 when the control system 270 is manufactured or may be updated by the manufacturer through the I/O interface 276 after the control system 270 is deployed. In some implementations, the parameters Kp, Ki, and/or G may be updated in real-time or near real-time based on a predictor model. In these implementations, initial values for Kp, Ki, and G may be stored on the electronic storage 274 and/or input by an operator through the I/O interface 276.

In some implementations, the control system 270 is configured such that the end user of the control system 270 is permitted to enter values for the control parameters through the I/O interface 276. Allowing the end user to enter values of the control parameters may increase the flexibility and robustness of the control system 270. In these implementations, the values of the control parameters are provided through the I/O interface 276 (642) and stored on the electronic storage 274 for use by the active control module 290.

The second command signal 295 is compared to an operating range associated with the second dispatchable energy source 215a (645). The operating range includes, for example, a minimum and maximum acceptable value for active or real power and a minimum and maximum acceptable value for reactive power. The operating range may be stored on the electronic storage 274 and/or on an electronic storage associated with the local control system 216b. The operating range may be different for various different dispatchable energy sources. Thus, in implementations in which the operating range is stored on the electronic storage 274, the operating range may be stored in association with an identifier that indicates which dispatchable energy source has that operating range.

The command signal 295 includes a P* command, which has a P value, and a Q* command, which has a Q value. The P value in the command signal 295 is compared to the minimum and maximum values of the active or real power. The Q value in the command signal 295 is compared to the minimum and maximum values of the reactive power. If the P value is between the minimum and maximum acceptable values of the active or real power, or if the P value is equal to the minimum or maximum acceptable value of the active or real power, then the P value is considered to be in the acceptable range. If the Q value is between the minimum and maximum acceptable values of the reactive power, or if the Q value is equal to the minimum or maximum acceptable value of the reactive, then the Q value is considered to be in the acceptable range, and the command signal 295 is applied to the second dispatchable energy source 215b (650).

Otherwise, the P and/or Q values of the command signal 295 are adjusted (647). For example, if the P value is less than the minimum acceptable value for active power, the P value in the command signal 295 is set to the minimum acceptable value for active power. If the P value is greater than the maximum acceptable value for active power, the P value in the command signal 295 is set to the maximum acceptable value for active power. Similarly, if the Q value is less than the minimum acceptable value for reactive power, the Q value in the command signal 295 is set to the minimum acceptable value for reactive power. If the Q value is greater than the maximum acceptable value for reactive power, the Q value in the command signal 295 is set to the maximum acceptable value for reactive power. After the command signal 295 has been adjusted, the command signal 295 is applied to the second dispatchable energy source 215b (650).

Applying the command signal 295 to the second dispatchable energy source 215b changes the active and reactive power of the AC voltage 218b produced by the source 215b. By changing the active and reactive power of the AC voltage 218b produced by the source 215b, the phase angle of the AC voltage 211 also changes. Thus, by controlling the active and reactive power of the AC voltage 218b, the phase angle of the AC voltage 211 is also controlled and is controlled to be closer in value to the phase angle of the AC voltage 231.

After the real and reactive power produced by the second dispatchable energy source 215b is adjusted by applying the command signal 295 at (650), the phase angle difference ($\Delta\varphi$) is determined (625). If the phase angle difference ($\Delta\varphi$) is greater than the phase angle threshold, the process returns to (640). If the phase angle difference ($\Delta\varphi$) is less than the phase angle threshold, the switching apparatus command is issued to the switching apparatus 252, and the switching apparatus 252 begins to transition to the second state to thereby connect the first power grid 210 and the second power grid 230.

By actively controlling the phase angle of the AC voltage 211, the control system 270 is able to hold the absolute value of phase angle difference ($\Delta\varphi$) to less than the phase angle threshold for a sufficient period of time (for example, at least 5 seconds) such that the switching apparatus 252 transitions to the second state while the absolute value of phase angle difference ($\Delta\varphi$) less than the phase angle threshold. Moreover, by actively controlling the phase angle of the AC voltage 211, the control system 270 and the process 600 allows synchronization even in the presence of load disturbances and intermittent power production (for example, by renewable sources that are not fully dispatchable).

The example discussed above relates to an implementation in which the characteristics of the AC voltage 211 are controlled until the AC voltage 211 is synchronized with the AC voltage 231. However, other implementations are possible. For example, in implementations in which in implementations in which the second power grid 230 also includes dispatchable energy sources, the control system 270 may control the dispatchable energy sources 215a and 215b as well as the dispatchable energy sources in the second power grid 230. The control system 270 may alternate controlling the dispatchable energy sources 215a and 215b with the dispatchable energy sources in the second power grid 230 until the AC voltage 211 and the AC voltage 233, or the control system 270 may control the first dispatchable energy source 215a, the second dispatchable energy source 215b, and the dispatchable energy sources in the second power grid 230 simultaneously.

Figure 7A:
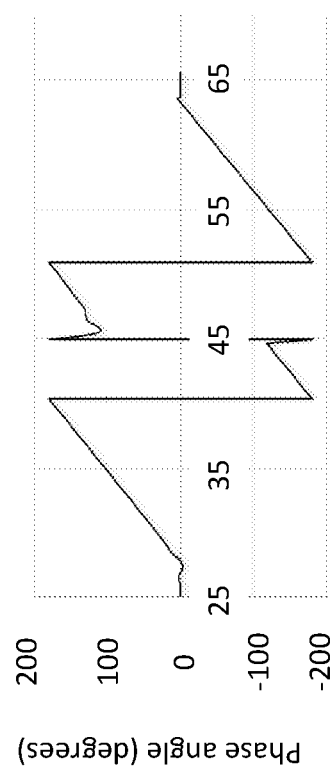
FIG. 7A shows example data.
Figure 7B:
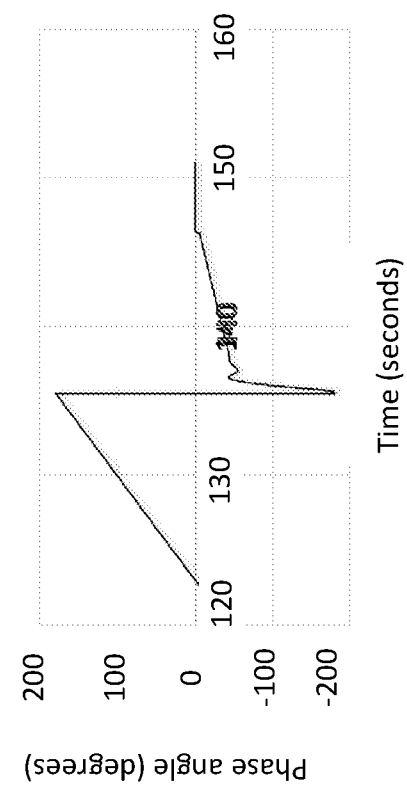
FIG. 7B shows example data.

FIGS. 7A and 7B show example data of phase angle difference ($\Delta\varphi$) between the AC voltage in a first power grid and in a second power grid as a function of time while the first and second power grids are disconnected from each other. The phase angle difference ($\Delta\varphi$) is determined from a single phase of AC voltages at nodes in the respective power grids that can be joined at a point of connection. FIG. 7A shows data for a traditional technique that uses only V-f control. That is, FIG. 7A shows data for a technique that synchronizes the AC voltages by only controlling the amplitude and frequency of AC voltage produced by a single dispatchable energy source. FIG. 7B shows data for a technique (such as discussed above with respect to FIGS. 4-6) that actively controls the phase angle difference ($\Delta\varphi$) by controlling a second dispatchable energy source in the P-Q mode. That is, the data shown in FIG. 7B is based on an approach that controls the real and reactive power output of the second dispatchable energy source and also applies V-f control to another dispatchable energy source.

In the data shown in FIG. 7A, a disturbance was applied at about 40 seconds. As shown, the V-f control did not achieve a phase angle difference ($\Delta\varphi$) of less than 10° over an appreciable amount of time until about 62 seconds, which is nearly 22 seconds after the disturbance was applied. In the data shown in FIG. 7B, the disturbance was applied at about 135 seconds. As shown, the phase angle difference ($\Delta\varphi$) was controlled to be less than 10° after about 10 seconds. Thus, the approach of the process 600 is able to bring the phase angle difference into specifications in half the time.

The foregoing implementations are provided as examples, and other implementations also may be within the scope of the claims.

What is claimed is:

1. A system comprising:
an interface configured to receive electrical data, the electrical data comprising:
an amplitude, frequency, and phase angle of at least one phase of an alternating current (AC) voltage at a first node in a first power grid, and
an amplitude, frequency, and phase angle of at least one phase of an AC voltage at a second node in a second power grid, wherein
the first power grid and the second power grid are configured to be operated independently of each other with the first node disconnected from the second node, or to be electrically connected to each other by electrically connecting the first node and the second node at a point of interconnection; and
the system further comprises a controller configured to:
access the electrical data;
determine an amplitude metric based on the amplitude of the AC voltage at the first node and the amplitude of the AC voltage at the second node;
determine a frequency metric based on the frequency of the AC voltage at the first node and the frequency of the AC voltage at the second node;
determine a phase angle metric by based on the phase angle of the AC voltage at the first node and the phase angle of the AC voltage at the second node;
compare the amplitude metric, frequency metric, and phase angle metric to respective amplitude, frequency, and phase angle thresholds; and
determine, based on the comparison, whether to control a first dispatchable energy source to adjust the amplitude and frequency of at least one phase of the AC voltage at the first node and whether to control a second dispatchable energy source to adjust the phase angle of at least one phase of the AC voltage at the first node.

2. The system of claim 1, wherein the amplitude metric comprises an absolute value of a difference between the amplitude of the AC voltage at the first node and the amplitude of the AC voltage at the second node; the frequency metric comprises an absolute value of a difference between the frequency of the AC voltage at the first node and the frequency of the AC voltage at the second node; and the phase angle metric comprises an absolute value of a difference between the phase angle of the AC voltage at the first node and the phase angle of the AC voltage at the second node.

3. The system of claim 2, wherein to determine whether to control the second dispatchable energy source, the controller is configured to determine whether the phase angle metric is equal to or greater than the phase angle threshold, and, if the phase angle metric is equal to or greater than the phase angle threshold, the controller applies a second command signal to the second dispatchable energy source; and wherein the second command signal comprises a P component and a Q component; the P component is a real power command, and the Q component is a reactive power command; and applying the second control signal to the second dispatchable energy source adjusts the phase angle of at least one phase of the AC voltage at the first node.

4. The system of claim 3, wherein the real power command comprises a real power value, the reactive power command comprises a reactive power value, and the controller is further configured to determine if the real power value is within a first pre-defined range of values, and to determine if the reactive power value is within a second pre-defined range of values.

5. The system of claim 4, wherein the controller sets the real power value to a maximum or minimum value of the first pre-determined range of values and sets the reactive power value to a maximum or minimum value of the second pre-determined range of values if the real power value is not within the first pre-defined range of values and the reactive power value is not within the second pre-defined range of values.

6. The system of claim 5, wherein the interface is further configured to receive input other than the electrical data, and the controller determines the second command signal based on the electrical data and the input other than the electrical data.

7. The system of claim 6, wherein the input other than the electrical data comprises one or more control parameters provided by an operator or a remote device through the interface.

8. The system of claim 3, wherein to determine whether to control the first dispatchable energy source, the controller is configured to:

determine whether the frequency metric is equal to or greater than the frequency threshold, and determine whether the amplitude metric is equal to or greater than the amplitude threshold; and if the frequency metric is equal to or greater than the frequency threshold and the amplitude metric is equal to or greater than the amplitude threshold, the controller applies a first command signal to the first dispatchable energy source; and wherein the first command signal is configured to control the first dispatchable energy source in a V-f control mode to control the amplitude and frequency of at least one phase of the AC voltage at the first node, wherein the first command signal comprises a V component and an f component, the V component being a voltage amplitude command, and the f component being a frequency command.

9. The system of claim 8, wherein the controller is configured to compare the amplitude metric to the amplitude threshold and to compare the frequency metric to the frequency threshold before comparing the phase angle metric to the phase angle threshold.

10. The system of claim 9, further comprising a switching apparatus comprising a first state and a second state, and wherein the switching apparatus electrically connects the first node of the first power grid to the second node of the second power grid at a point of interconnection when in the second state, and if the phase angle metric does not exceed the phase angle threshold, the amplitude metric does not exceed the amplitude threshold, and the frequency metric does not exceed the frequency threshold, the controller provides a switching apparatus command to the switching apparatus to cause the switching apparatus to transition from the second state to the first state to electrically connect the second power grid and the first power grid.

11. The system of claim 10, wherein the switching apparatus comprises a recloser, the first state comprises a closed state, and the second state comprises an opened state.

12. The system of claim 1, wherein the AC voltage at the first node has N phases; the AC voltage at the second node has N phases; N is an integer value that is greater than or equal to one; and the amplitude metric, the frequency metric, and the phase angle metric are determined for each of the N phases.

13. The system of claim 1, wherein the first power grid comprises a microgrid, and the second power grid comprises a microgrid or a utility grid.

14. The system of claim 13, wherein the amplitude, frequency, and phase of the second power grid are not adjustable.

15. The system of claim 1, wherein the first dispatchable energy source comprises a first distributed energy resource (DER), and the second dispatchable energy source comprises a second distributed energy resource (DER).

16. The system of claim 1, wherein the first dispatchable energy source and the second dispatchable energy source are associated with the first power grid; and the amplitude, frequency, and phase of the second power grid are not adjustable.

17. The system of claim 1, wherein the second grid comprises a third dispatchable energy source and a fourth dispatchable energy source; and the controller is further configured to determine whether to control the third dispatchable energy source to adjust the amplitude and frequency of at least one phase of the AC voltage at the second node and whether to control the fourth dispatchable energy source to adjust the phase angle of at least one phase of the AC voltage at the second node.

18. The system of claim 1, wherein the first dispatchable energy source and the second dispatchable energy source are associated with the first power grid.

19. The system of claim 18, wherein the controller is associated with the second power grid and is configured to communicate with the first dispatchable energy source and the second dispatchable energy source.

20. A method of electrically connecting a first node of a first power grid to a second node of a second power grid, the method comprising:

determining a phase angle of at least one phase of an AC voltage at the first node in the first power grid;

determining a phase angle of at least one phase of an AC voltage at the second node in the second power grid;

determining a phase angle metric based on comparing the phase angle of the AC voltage in the first power grid to the phase angle of the AC voltage in the second power grid;

comparing the phase angle metric to a phase angle threshold; and if the phase angle metric is equal to or exceeds the phase angle threshold, controlling a dispatchable energy source in the first power grid in a P-Q control mode to adjust the phase angle of at least one phase of the AC voltage at the first node.

21. The method of claim 20, further comprising:
determining an amplitude metric by comparing an amplitude of at least one phase of the AC voltage at the first node and an amplitude of at least one phase of AC voltage at the second node;
determining a frequency metric by comparing a frequency of at least one phase of AC voltage in the second power grid and a frequency of at least one phase of AC voltage in the first power grid;
comparing the amplitude metric to an amplitude threshold;
comparing the frequency metric to a frequency threshold; and
if the amplitude metric exceeds the amplitude threshold and the frequency metric exceeds the frequency threshold, controlling the voltages and frequencies of electrical voltage produced by another dispatchable energy source in the first power grid to adjust the voltage and frequency of at least one phase of the AC voltage at the first node.

22. The method of claim 21, further comprising:
if the phase angle metric does not exceed the phase angle threshold, the amplitude metric does not exceed the amplitude metric, and the frequency metric does not exceed the frequency metric, controlling a switching apparatus to electrically connect the first node and the second node to thereby electrically connect the first power grid and the second power grid at a point of interconnection.

23. The method of claim 20, wherein the dispatchable energy source controlled in the P-Q mode is a second dispatchable energy source in the first power grid, and the method further comprises:
controlling a first dispatchable energy source in the first power grid in a V-f mode to thereby control a frequency difference between the AC voltage at the first node and the AC voltage at the second node, and wherein
controlling the second dispatchable energy source in the first power grid in the P-Q mode comprises controlling the second dispatchable energy source in the first power grid in the P-Q mode to thereby inject power into or remove power from the first power grid to adjust the phase angle of at least one phase of the AC voltage at the first node.

24. The method of claim 23, further comprising:
measuring a power output of the first dispatchable energy source, which is in the V-f mode; and
adjusting the power output of the second dispatchable energy source, which is in the P-Q mode, such that the power output of the first dispatchable energy source which is in the V-f mode, is not affected by controlling the second dispatchable energy source in the P-Q mode.

25. The method of claim 20, further comprising:
if the phase angle metric is equal to or exceeds the phase angle threshold, controlling a dispatchable energy source in the second power grid in a P-Q control mode to adjust the phase angle of at least one phase of the AC voltage at the second node.

26. A controller for electrically connecting a second power grid to a first power grid, the controller comprising:
an electronic processing module; and
an electronic storage coupled to the electronic processing module, the electronic storage comprising instructions that, when executed, cause the electronic processing module to:
access electrical data from the first power grid and from the second power grid to determine one or more synchronization metrics;
compare the one or more synchronization metrics to a specification;
determine whether or not to electrically connect the second power grid to the first power grid based on the comparison;
if it is determined to electrically connect the second power grid to the first power grid, control a switching apparatus to electrically connect the second power grid to the first power grid; and
if it is determined to not electrically connect the second power grid to the first power grid:
control a first dispatchable energy source in a V-F control mode to control a difference between the amplitude and frequency of the AC voltage in the first power grid and the amplitude and frequency of the AC voltage in the second power grid; and
control a second dispatchable energy source in a P-Q control mode to reduce a difference between a phase angle of the AC voltage in the first power grid and a phase angle of the AC voltage in the second power grid.

27. The controller of claim 26, wherein controlling the first dispatchable energy source in V-F control adjusts an amplitude and frequency of the AC voltage in the first power grid to control the difference between the amplitude and frequency of the AC voltage in the first power grid and the amplitude and frequency of the AC voltage in the second power grid.

28. The controller of claim 27, wherein the synchronization metrics comprise: an amplitude metric, a frequency metric, and a phase angle metric.

29. The controller of claim 28, wherein:
the amplitude metric comprises a difference between an amplitude of an AC voltage at a first node in the first power grid and an amplitude of an AC voltage at a second node in the second power grid;
the frequency metric comprises a difference between a frequency of an AC voltage at the first node in the first power grid and a frequency of an AC voltage at the second node in the second power grid; and
the phase angle metric comprises a difference between a phase angle of an AC voltage at the first node in the first power grid and a phase angle of an AC voltage at the second node in the second power grid.

30. The controller of claim 26, wherein the first dispatchable energy source and the second dispatchable energy source are in the first power grid; and the controller is remote from the first power grid.

31. The controller of claim 26, further comprising instructions that, when executed, cause the electronic processor to, if it is determined to not electrically connect the second power grid to the first power grid:
control a third dispatchable energy source in a V-F control mode to control the difference between the amplitude and frequency of the AC voltage in the first power grid and the amplitude and frequency of the AC voltage in the second power grid; and
control a fourth dispatchable energy source in a P-Q control mode to reduce the difference between a phase angle of the AC voltage in the first power grid and a phase angle of the AC voltage in the second power grid, wherein
the first and second dispatchable energy sources are in the first power grid, and the third and fourth dispatchable energy sources are in the second power grid.

32. The controller of claim 26, wherein the specification comprises a range of acceptable values.

33. The controller of claim 26, wherein the specification comprises a threshold value.

34. A system comprising:
a control apparatus comprising:
an electronic processing module; and
an electronic storage coupled to the electronic processing module, the electronic storage comprising instructions that, when executed, cause the electronic processing module to:
determine a phase angle of at least one phase of an AC voltage a first node in a first power grid;
determine a phase angle of at least one phase of an AC voltage a second node in a second power grid;
determine a phase angle metric based on comparing the phase angle of the AC voltage in the first power grid to the phase angle of the AC voltage in the second power grid;
compare the phase angle metric to a phase angle threshold;
if the phase angle metric exceeds the phase angle threshold, control a dispatchable energy source in the first power grid in a P-Q control mode to adjust the phase angle of at least one phase of the AC voltage at the first node; and
if the phase angle metric does not exceed the phase angle threshold, control a switching apparatus to electrically connect the first power grid and the second power grid.

35. The system of claim 34, wherein, the instructions further comprise instructions, that when executed, cause the electronic processing module to, if the phase angle metric does not exceed the phase angle threshold, control the dispatchable energy source such that the phase angle metric does not exceed the phase angle threshold during a time period, the time period being equal to or greater than a switching operation time associated with the switching apparatus.

36. The system of claim 34, wherein the phase angle metric is a value, the phase angle threshold comprises a range of values, and the phase angle metric exceeds the phase angle threshold when the phase angle metric is outside of the range of values.

37. The system of claim 34, wherein the phase angle metric is a value, the phase angle threshold is a single value, and the phase angle metric exceeds the phase angle threshold when the phase angle metric is greater than the single value.

38. The system of claim 34, further comprising the switching apparatus.

* * * * *